(12) United States Patent
Amanapu et al.

(10) Patent No.: US 10,833,122 B2
(45) Date of Patent: Nov. 10, 2020

(54) BOTTOM ELECTRODE AND DIELECTRIC STRUCTURE FOR MRAM APPLICATIONS

(71) Applicant: INTERNATIONAL BUSINESS MACHINES CORPORATION, Armonk, NY (US)

(72) Inventors: Hari Prasad Amanapu, Guilderland, NY (US); Raghuveer Patlolla, Guilderland, NY (US); Cornelius Brown Peethala, Slingerlands, NY (US); Michael Rizzolo, Delmar, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 38 days.

(21) Appl. No.: 16/241,866

(22) Filed: Jan. 7, 2019

(65) Prior Publication Data

US 2020/0219931 A1    Jul. 9, 2020

(51) Int. Cl.
| | | |
|---|---|---|
| H01L 27/22 | (2006.01) |
| H01L 43/02 | (2006.01) |
| H01L 43/08 | (2006.01) |
| H01L 43/12 | (2006.01) |

(52) U.S. Cl.
CPC .......... *H01L 27/222* (2013.01); *H01L 43/02* (2013.01); *H01L 43/08* (2013.01); *H01L 43/12* (2013.01)

(58) Field of Classification Search
CPC ....... H01L 27/222; H01L 43/02; H01L 43/08; H01L 43/12; G11C 11/14–16
See application file for complete search history.

(56) References Cited

U.S. PATENT DOCUMENTS

| | | |
|---|---|---|
| 6,165,803 A | 12/2000 | Chen et al. |
| 6,821,309 B2 | 11/2004 | Singh et al. |
| 7,375,388 B2 | 5/2008 | Yates et al. |
| 7,611,912 B2 | 11/2009 | Hong et al. |
| 7,772,116 B2 | 8/2010 | Akram et al. |
| 7,999,360 B2 | 8/2011 | Hong et al. |
| 8,673,654 B2 | 3/2014 | Hong et al. |
| 8,866,242 B2 | 10/2014 | Li et al. |
| 10,096,769 B2 | 10/2018 | Bhosale et al. |
| 2018/0287051 A1 | 10/2018 | Bhosale et al. |
| 2019/0165258 A1* | 5/2019 | Peng ............... H01L 43/12 |

OTHER PUBLICATIONS

List of IBM Patents or Patent Applications Treated as Related; (Appendix P), Date Filed Jan. 8, 2019; 2 pages.

* cited by examiner

*Primary Examiner* — Allison Bernstein
(74) *Attorney, Agent, or Firm* — Cantor Colburn LLP (57) ABSTRACT

A substantially flat bottom electrode embedded in a dielectric for magnetoresistive random access memory (MRAM) devices includes pre-filling the contact via prior to filling the trench with tantalum nitride in a via/trench structure. The top surface of the substantially flat bottom electrode is coplanar to the top surface of the dielectric.

16 Claims, 7 Drawing Sheets

BOTTOM ELECTRODE AND DIELECTRIC STRUCTURE FOR MRAM APPLICATIONS

BACKGROUND

This invention relates generally to formation of MRAM (magnetic random access memory) cells in a semiconductor device, and more particularly, to magnetic tunneling junction (MTJ) structures and methods of fabricating a bottom electrode and dielectric structure for such a device, wherein the method and structure provides a bottom electrode having a flat surface coplanar to the dielectric.

The MTJ device is essentially a magnetic switch which permits or prevents the flow of spin-polarized tunneling electrons (i.e. the device has a low or a high resistance) through a very thin dielectric spacer layer formed between an upper and lower electrode. Because the tunneling is spin-polarized, the current depends upon the relative orientation of the magnetizations of magnetic layers above and below the spacer layer. One of the two magnetic layers (the pinned layer) in the MTJ has its magnetization fixed in direction, while the other layer (the free layer) has its magnetization free to move in response to an external switching stimulus. Planarity variations between the bottom electrode and the adjacent dielectric prior to fabrication of the MTJ devices can cause topography, which causes poor grain growth and defects in the deposited MTJ.

SUMMARY

Embodiments of the present invention are generally directed to magnetoresistive random access memory (MRAM) devices and processes for forming a bottom electrode and dielectric structure in the MRAM device. A non-limiting example of a MRAM device in accordance with one or more aspects of the present invention includes a bottom electrode embedded within a trench of a trench/via structure in a dielectric layer. The bottom electrode includes tantalum nitride. A via embedded in the dielectric layer provides a conductive pathway to the bottom electrode and an underlying interconnect structure. The via includes tantalum, cobalt, ruthenium, or tungsten. A metal hardmask is intermediate the via and the bottom electrode, wherein the metal hardmask includes titanium, titanium nitride, tantalum, tantalum nitride, ruthenium, or tungsten.

A non-limiting example of a method of forming a bottom electrode and dielectric structure for a MRAM device in accordance with one or more aspects of the present invention includes filling a via in a trench/via structure embedded within a dielectric with a metal. The metal includes tantalum, cobalt, ruthenium, or tungsten. A metal hardmask is conformally deposited. Tantalum nitride is deposited into the trench forming an overburden of the tantalum nitride. The tantalum nitride is planarized to the metal hardmask. The metal hardmask is removed from field surfaces and a portion of the tantalum nitride such that a top surface of the tantalum nitride is coplanar to a top surface of the dielectric layer to form the bottom electrode.

A non-limiting example of a method of forming a bottom electrode and dielectric structure for a MRAM device in accordance with one or more aspects of the present invention includes conformally depositing tungsten in an amount effective to fill a via in a trench/via structure embedded within a dielectric. The tungsten is removed from sidewalls of the trench and field surfaces. A metal hardmask is conformally deposited. Tantalum nitride is deposited into the trench and forming an overburden of the tantalum nitride. The tantalum nitride is planarized to the metal hardmask. The metal hardmask is removed from field surfaces and a portion of the tantalum nitride such that a top surface of the tantalum nitride is coplanar to a top surface of the dielectric layer to form the bottom electrode.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure ("FIG.") 1 is a schematic cross-sectional view depicting a bottom electrode and cap structure formed in a dielectric layer prior to a planarization process.

DETAILED DESCRIPTION

The present invention is generally directed to bottom electrode and dielectric structures and methods of fabrication for subsequent formation of a magnetic tunneling junction (MTJ) device thereon. Bottom electrode structures of an MTJ device typically include a recessed bulk metal conductive line embedded within a dielectric layer. The bottom electrode structure further includes a cap layer such as tantalum nitride disposed within the recess. To form a good, low-resistance MTJ on the bottom electrode structure requires good control of the surface roughness of the bottom electrode.

Processes for forming the bottom electrode for MTJ device fabrication thereon typically include a chemical mechanical planarization (CMP) process subsequent to the self-aligned deposition of the cap layer into the recess of the recessed metal conductor to planarize the surfaces of the cap layer and the adjacent dielectric layer so as to provide a flat and coplanar surface.

CMP is a planarization process for smoothing surfaces with the combination of chemical and mechanical forces. The process generally includes an abrasive and corrosive chemical slurry (commonly a colloid) in conjunction with a polishing pad and retaining ring, typically of a greater diameter than the wafer. The pad and wafer are pressed together by a dynamic polishing head and held in place by a plastic retaining ring. The dynamic polishing head is rotated with different axes of rotation. This removes excess material and tends to even out any irregular topography, making the wafer flat or planar. However, CMP of the bottom electrode structure to planarize the surface after formation of the cap layer results in dielectric dishing (also referred to as dielectric recess formation) within the dielectric material. The dielectric dishing results in unwanted topography that is transferred during subsequent fabrication of the MTJ stack. Moreover, the resulting topography deleteriously causes non-columnar grain growth and increased defectivity to occur.

The present invention is generally directed to substantially eliminating the dielectric recess by providing a substantially flat and coplanar surface having a roughness of less than about 3 nanometers (nm) in one or more embodiments, a surface roughness of less than about 2 nm in one or more other embodiments, and a surface roughness of less than about 1 nm in still other embodiments.

As used herein, the terms "invention" or "present invention" are non-limiting terms and not intended to refer to any single aspect of the particular invention but encompass all possible aspects as described in the specification and the claims.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the term "about" "substantially," "approximately," and equivalents thereof modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

Figure 1:
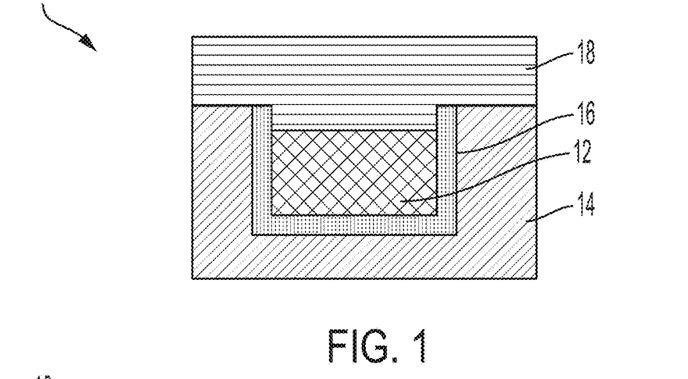
Figure 2:
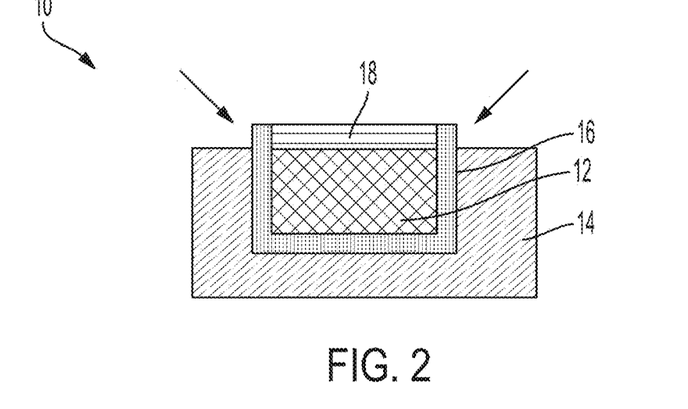
FIG. 2 is schematic cross-sectional view of the partially completed integrated circuit structure of FIG. 1 subsequent to a planarization process, wherein the dielectric is recessed relative to the top of the neighboring metal.

FIGS. 1 and 2 depict cross sectional views of a typical bottom electrode structure 10 before and after a planarization process, respectively, to remove the excess cap layer material and planarize the underlying surfaces. In FIG. 1, the before structure 10 includes a recessed bulk metal conductor 12 embedded within a dielectric layer 14. A barrier layer 16 is intermediate the bulk conductor layer and the dielectric layer 14 so as to prevent electromigration of the metal conductor into the dielectric. The cap layer material 18 fills the recess. Excess cap material resulting from the blanket deposition overlies the bulk metal conductor 12 and the dielectric layer 14.

Optionally, in one or more embodiments, a liner layer (not shown), such as, for example, cobalt, ruthenium, alloys thereof, or the like can be positioned between the barrier layer 16 and the metal conductor 12. For example, cobalt can be present in one or more thin layers as a liner layer (e.g., 1 to 100 angstroms) between a tantalum nitride barrier layer and a copper metal conductor.

The before structure can be formed by a damascene process, which generally includes lithographically patterning and etching the dielectric layer 14 to form openings in the dielectric layer in a manner known in the art. A conformal thin barrier 16 layer is then deposited into the patterned openings. A bulk metal conductor, such as copper, is subsequently deposited using, in one or more embodiments, a chemical vapor deposition (CVD) technique, plasma enhanced CVD, vacuum evaporation, electroplating, or sputtering technique. Next, a chemical-mechanical polishing (CMP) process is utilized to planarize the different features across the surface of the dielectric layer 14. The CMP planarization process applies a substantially uniform material removal rate of the bulk conductor and the dielectric material across a plane of the substrate surface, which substantially ensures that the substrate is uniformly reduced in height across the plane of the substrate surface. A wet etch process can then be used to recess the metal conductor 12 relative to the dielectric layer 14 by selectively removing a portion of the metal conductor. A cap layer 18 such as tantalum nitride is then blanket deposited onto the substrate, thereby filling the recess and serving to protect the conductor from electromigration, moisture, oxidation, and the like.

FIG. 2 shows the structure 10 subsequent to the planarization process, e.g., post CMP. As indicated by arrows 20, the dielectric material 14 adjacent to the conductive material 12 is not coplanar with the top surface of the cap layer 18 overlaying the conductive line 12. In reality, the recess has an arcuate shape and resembles a radius of a dish, hence reference to dielectric dishing.

Formation of the after structure of FIG. 2 includes subjecting the substrate shown in FIG. 1 to a planarization process such as CMP to remove the excess cap layer and planarize the surface. Because the material selected for the cap layer is typically more resistant to the CMP process, dielectric dishing results within the adjacent dielectric layer because this material is more easily removed than the cap layer material. That is, the surface after planarization is not very flat in the adjacent regions of dielectric material between conductive lines. When the MTJ device is later formed on the bottom electrode, the topography caused by the dielectric dishing results in non-columnar grain growth during a subsequent annealing step, which interferes with effective formation of a bottom synthetic anti-ferromagnetic layer in the MTJ stack.

Figure 3:
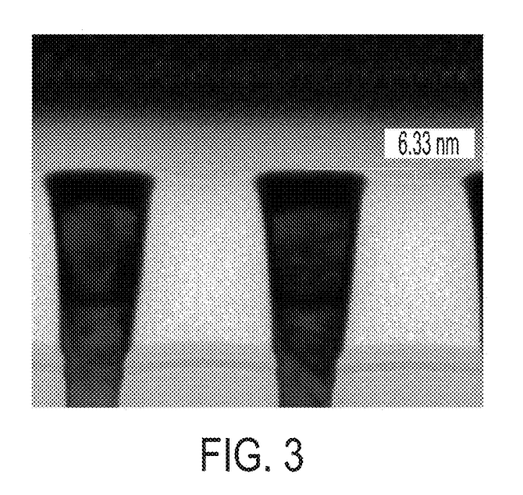
FIG. 3 is a photomicrograph depicting a dielectric recess subsequent to planarization of a bottom electrode and cap structure formed in a dielectric layer.

FIG. 3 provides a cross sectional micrograph showing the dishing in the dielectric layer between adjacent conductive lines subsequent to CMP, which is also referred to as the dielectric recess problem. In the illustrated cross section, the difference between the heights from the planarized top surface of the cap layer to the bottom of the dielectric recess in the dielectric layer subsequent to CMP was 6.33 nm. Because of the dielectric recess, the granularity in the bottom electrode of the MTJ is deleteriously affected during an annealing process.

Figure 4:
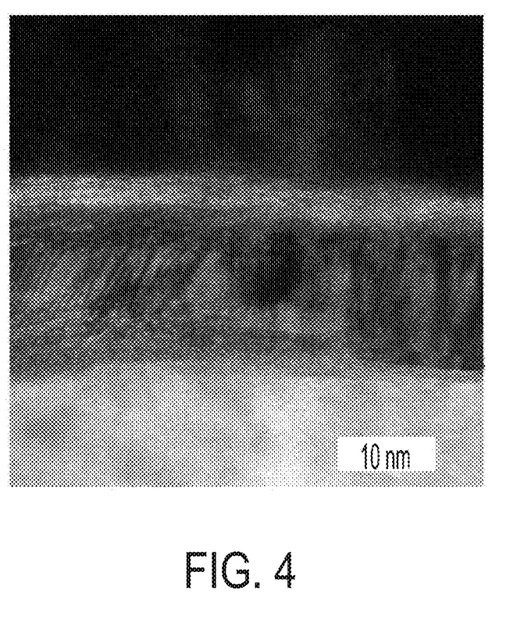
FIG. 4 is a photomicrograph depicting non-columnar grain formation in a magnetic tunnel junction device formed on a substrate exhibiting dielectric recess subsequent to planarization of a bottom electrode and cap structure formed in a dielectric layer.

FIG. 4 provides a cross sectional micrograph of an MTJ device fabricated on a structure where dielectric dishing was evident. When the subsequent MTJ is deposited, the topography causes grain growth to become poor as evidenced by non-columnar grain growth and increased defectivity, which interferes with effective formation of the bottom antiferromagnetic layer of the MTJ device.

In the present invention, the methods and structures as described herein address the problems associated in the prior art. Various embodiments include, inter alia, selective filling of contact via, and metal hardmask deposition to provide a substantially flat bottom electrode surface formed of tantalum nitride that is coplanar to the adjacent surfaces of the dielectric layer with minimal or no dielectric dishing, which is a significant advantage over the prior art as good columnar growth of the MTJ stack can be obtained.

Figure 5:
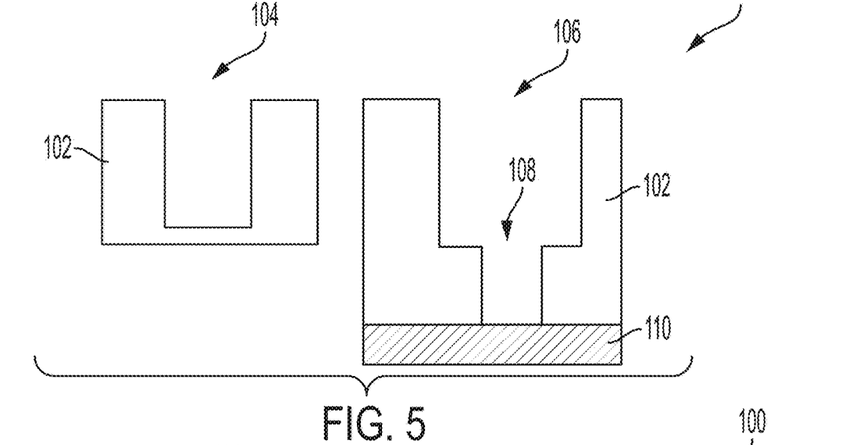
FIG. 5 is a schematic cross-sectional view of a dielectric layer subsequent to trench and via formation in the dielectric layer.

Referring now to FIG. 5, a structure 100 is provided. The structure 100 includes a dielectric layer 102 subsequent to formation of one or more trench structures 104 and trench/via structures 106. The vias 108 within each of the trench/via structures provide conducting paths through the dielectric layer 102 to connect the underlying interconnects of different conductor layers 110.

The dielectric material 102 can be formed by chemical vapor deposition (CVD), spin-on, sputtering, or other suitable methods. The dielectric material 102 can include silicon oxide, silicon oxynitride, or a suitable low-k material. By "low-k," it is meant that the dielectric constant of a particular dielectric material is less than that of silicon dioxide. After the dielectric material 102 has been deposited, a portion of the dielectric material 102 is selectively removed to form the trench and via structures. The trenches and vias can be formed lithographically utilizing, for example, a single damascene process, or a dual damascene, or the like as is known in the art. In an exemplary embodiment, the dielectric material 102 is removed by patterning a photoresist film over the dielectric material 102 and performing a reactive ion etch (ME) to remove the exposed dielectric material 102.

The conductor 110 can be any low resistance metal such as copper, tungsten, aluminum, alloys thereof, and the like.

Figure 6:
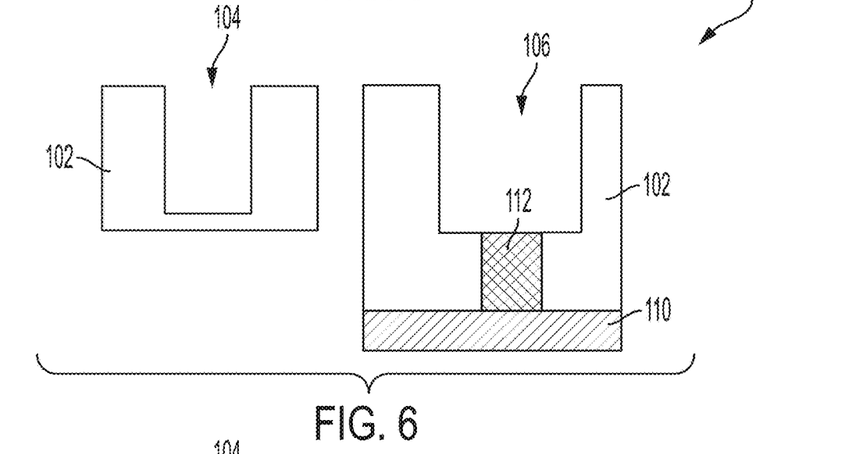
FIG. 6 is a schematic cross-sectional view of the structure of FIG. 5 subsequent to selective via pre-fill.

As shown in FIG. 6, after trench/via patterning and opening any capping layer (not shown) to expose conductor 110, the vias 108 are selectively pre-filled with an tantalum or a cobalt/ruthenium. Tantalum can be deposited using an electroless process as is known in the art. The cobalt/ruthenium can be deposited by chemical vapor deposition as is known in the art. The pre-filled vias are indicated by reference numeral 112. Low resistant metals such as copper are not needed in the contact vias because the resistance of the MTJ will dominate. Instead, contact via resistance is more important than having a low resistant metal, thereby permitting the use of tantalum or cobalt/ruthenium for the contact vias.

Figure 7:
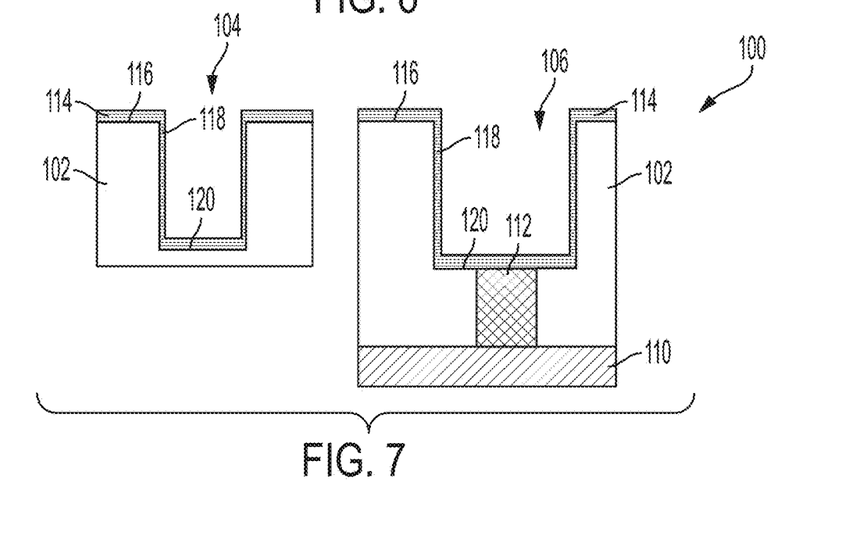
FIG. 7 is a schematic cross-sectional view of the structure of FIG. 6 subsequent to conformal deposition of a metal hardmask onto the structure.

FIG. 7 illustrates a cross-sectional view of the structure 100 of FIG. 6 subsequent to deposition of a metal hardmask 114. As shown, the metal hardmask 114 is conformally deposited in the trench and trench/via structures along the upper surface 116 of the dielectric layer 102, which are also referred to as the field surfaces, along the trench sidewalls 118, and along the bottom surface 120 of the trench 104 (including the top surface of the pre-filled via 110, where indicated). The metal hardmask 114 can be formed from a transition metal or nitrides thereof and can include a stack of materials. Exemplary transition metals includes, without limitation, titanium, titanium nitride, tantalum, tantalum, nitride, ruthenium, tungsten, and the like. Each material can be deposited by ionized physical vapor deposition (PVD), atomic layer deposition (ALD) or another suitable process.

Figure 8:
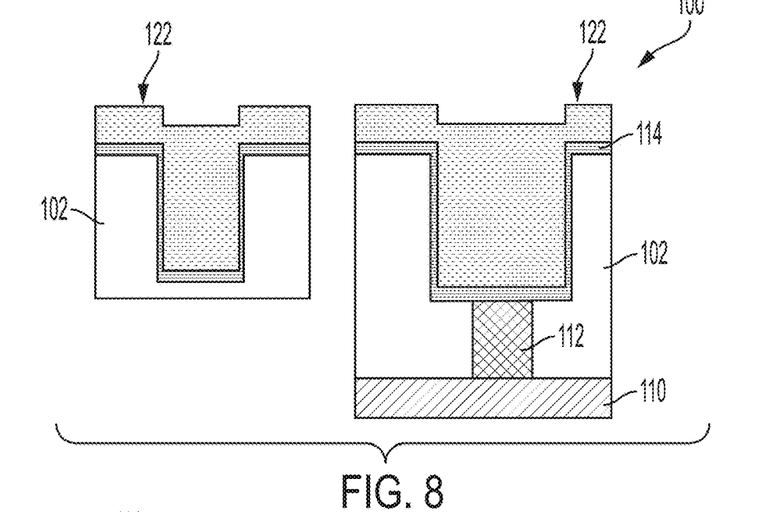
FIG. 8 is a schematic cross-sectional view of the structure of FIG. 7 subsequent to trench fill with tantalum nitride.

FIG. 8 is a schematic cross-sectional view of the structure of FIG. 7 subsequent to deposition of a fill metal 122 over the metal hardmask 114 that fills the open trenches 104 and forms an overburden 122. In one or more embodiments, the fill metal can be tantalum nitride, which will be utilized to define the bottom electrode for the MTJ structure. The tantalum nitride fill metal can be deposited by sputtering, physical vapor deposition (PVD), atomic layer deposition (ALD), or other suitable methods.

Figure 9:
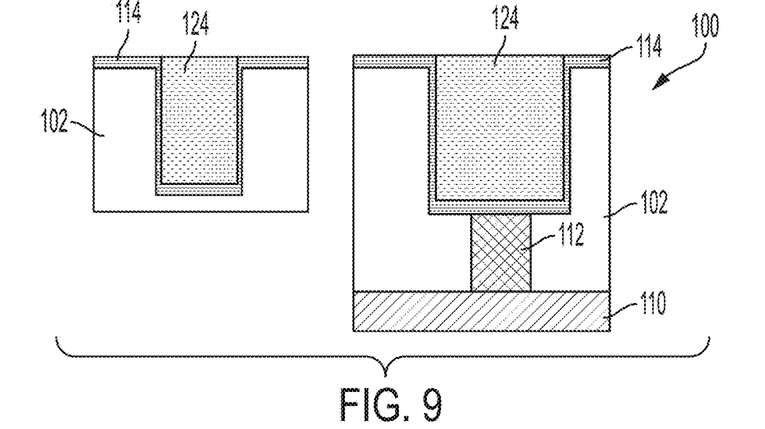
FIG. 9 is a schematic cross-sectional view of the structure of FIG. 8 subsequent to overburden removal to the metal hardmask.

FIG. 9 is a schematic cross-sectional view of the structure of FIG. 8 subsequent to removal of the overburden 122 stopping at the metal hardmask 114 such that metal filled trench portions 124 are formed that are coplanar with the metal hardmask 114. For example, the overburden 122 can be removed by chemical mechanical polishing (CMP). The CMP process planarizes the surface to remove the overburden by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Figure 10:
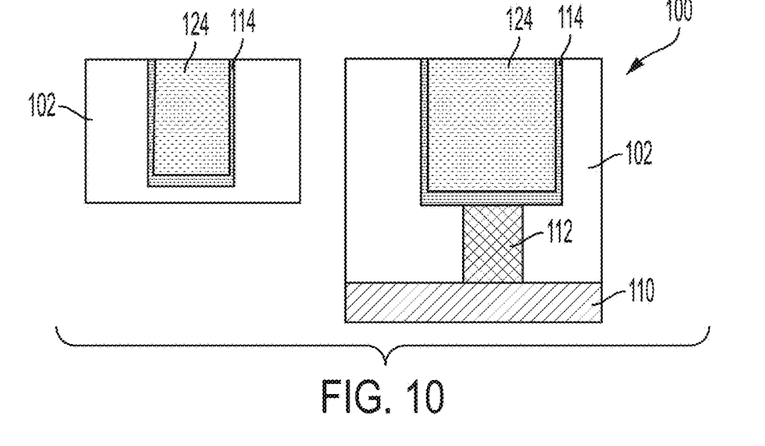
FIG. 10 is a schematic cross-sectional view of the structure of FIG. 9 subsequent to wet etch of the metal hardmask and a portion of the tantalum nitride to the dielectric layer.

FIG. 10 is a schematic cross-sectional view of the structure of FIG. 9 subsequent to wet etch of the metal hardmask 114 and a portion of the tantalum nitride filled trench portion 124 to the dielectric layer 102. The wet etch chemistry is selective to the dielectric layer 102 and can be used to remove the fill metal and the metal hardmask at about the same rate such that the metal filled trench portion 120 and the dielectric layer 102 are substantially coplanar. In one or more embodiments, the wet etch chemistry can include hydrogen peroxide, tetraethyl ammonium hydroxide, and benzotriazole deionized (DI) water at a pH in the range of about 4 to about 12 Etching can be performed at a temperatures ranging from about 25° C. to about 70° C.

Figure 11:
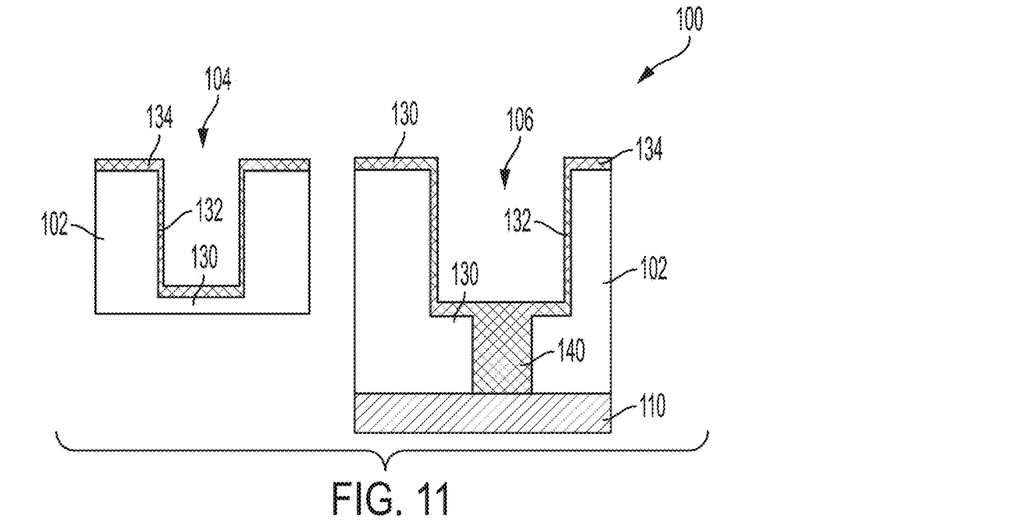
FIG. 11 is a schematic cross-sectional view of the structure of FIG. 5 subsequent to selective via pre-fill with a tungsten metal.

FIG. 11 is a schematic cross-sectional view of the trench and trench/via structures of FIG. 5 subsequent to conformal deposition of a tungsten metal 130 to fill the via 106 within the trench via structure and form a tungsten filled via 140. Conformal deposition results in tungsten formation on sidewalls 132 and bottom surfaces 130 that define the trench 104, and field surfaces 134.

Figure 12:
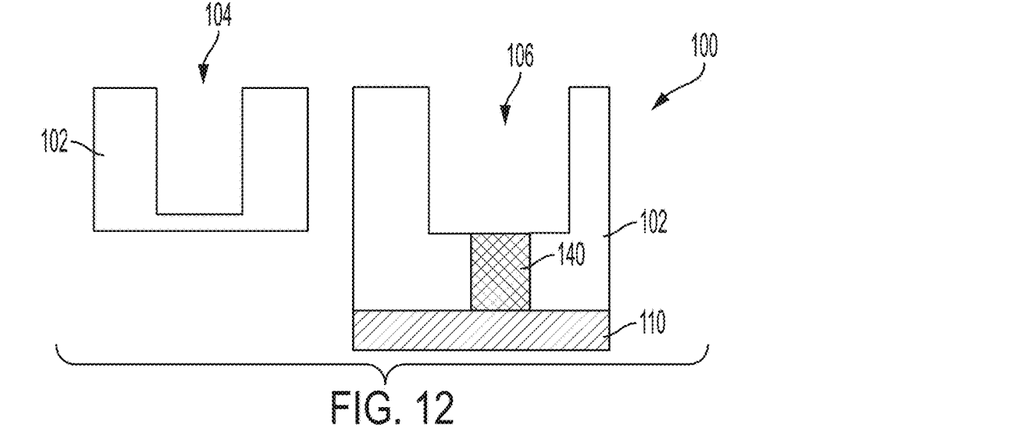
FIG. 12 is a schematic cross-sectional view of the structure of FIG. 11 subsequent to wet removal of tungsten from sidewalls and the field.

FIG. 12 is a schematic cross-sectional view of the structure of FIG. 11 subsequent to wet etch removal of the tungsten from the sidewalls 132 and bottom surfaces 130 of the trench 104 and the field surfaces 134. As such the trenches within the trench structure 104 and the trench/via structure 106 are free of tungsten on sidewalls, bottom surfaces and the field surfaces. The tungsten filled via 140 is substantially coplanar to the bottom surface of trench/via structure.

Figure 13:
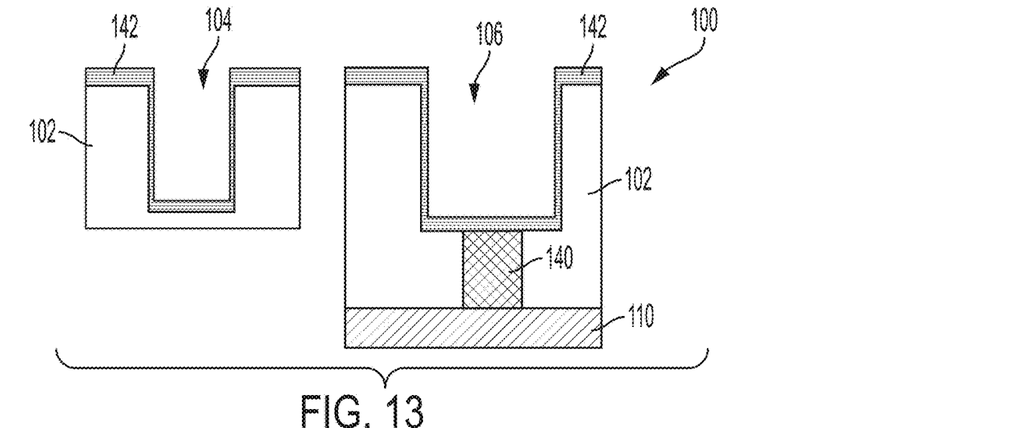
FIG. 13 is a schematic cross-sectional view of the structure of FIG. 12 subsequent to conformal deposition of a metal hardmask onto the structure.

FIG. 13 is a schematic cross-sectional view of the structure of FIG. 12 subsequent to conformal deposition of a metal hardmask 142 onto the structure. As shown, the metal hardmask 142 is conformally deposited in the trench and trench/via structures along the field surface of the dielectric layer 102, along the trench sidewalls 116, and along the bottom surface 118 of the trench 104 (including the top surface of the pre-filled via 110, where indicated). The metal hardmask 142 can be formed from a transition metal or nitrides thereof and can include a stack of materials. Exemplary transition metals includes, without limitation, titanium, titanium nitride, tantalum, tantalum, nitride, ruthenium, tungsten, and the like. Each material can be deposited by ionized physical vapor deposition (PVD), atomic layer deposition (ALD) or another suitable process. The process can be continued as described in FIGS. 8-10.

FIGS. 14-17 are a schematic cross-sectional views of the structure of FIG. 13 subsequent to filling the trenches in the trench structures 104 and the trench/via structures 106.

Figure 14:
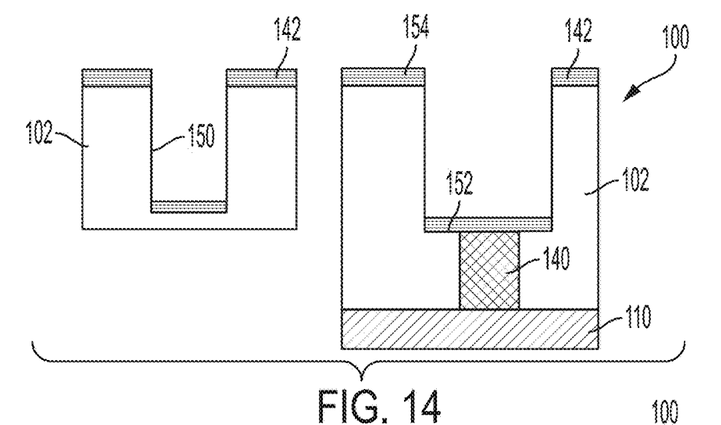
FIG. 14 is a schematic cross-sectional view of the structure of FIG. 13 subsequent to wet etching to remove the metal hardmask on sidewalls of the trench.

In FIG. 14, the metal hardmask 142 is removed from the sidewalls 150 of the trench structures using a wet etch process. In embodiments of the invention, the wet etch process can uses a wet etch solution that includes a mixture of an oxidizer (e.g., hydrogen peroxide—$H_2O_2$) and a pH adjusting agent (e.g., ammonium hydroxide—$NH_4OH$). Processing time is targeted to remove the material on the sidewall while retaining most of the film at the top and bottom. The metal hardmask 142 remains on bottom surfaces 152 and field surfaces 154 as shown.

Figure 15:
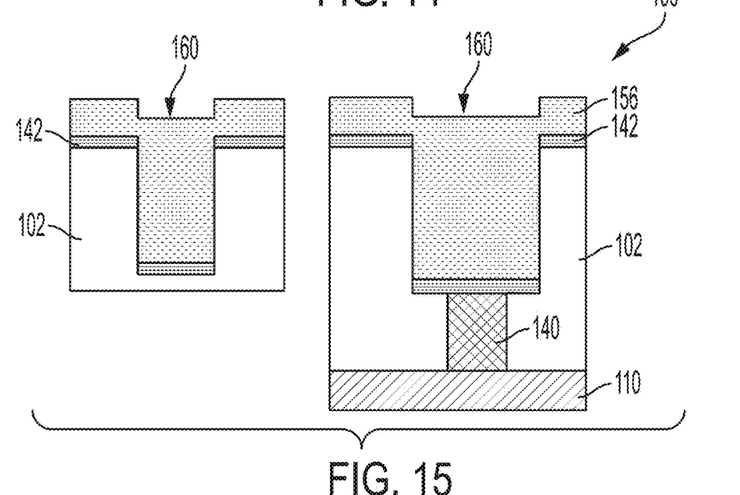
FIG. 15 s is a schematic cross-sectional view of the structure of FIG. 14 subsequent to trench fill with tantalum nitride.

Referring to FIG. 15 is a schematic cross-sectional view of the structure of FIG. 15 subsequent to deposition of a fill metal 160 over the metal hardmask 142, which fills the open trenches in the trench structure 104 and the trench/via structure 106 and forms an overburden 156. In one or more embodiments, the fill metal can be tantalum nitride, which will be utilized to define the bottom electrode for the MTJ structure. The tantalum nitride fill metal can be deposited by sputtering, physical vapor deposition (PVD), atomic layer deposition (ALD), or other suitable methods.

Figure 16:
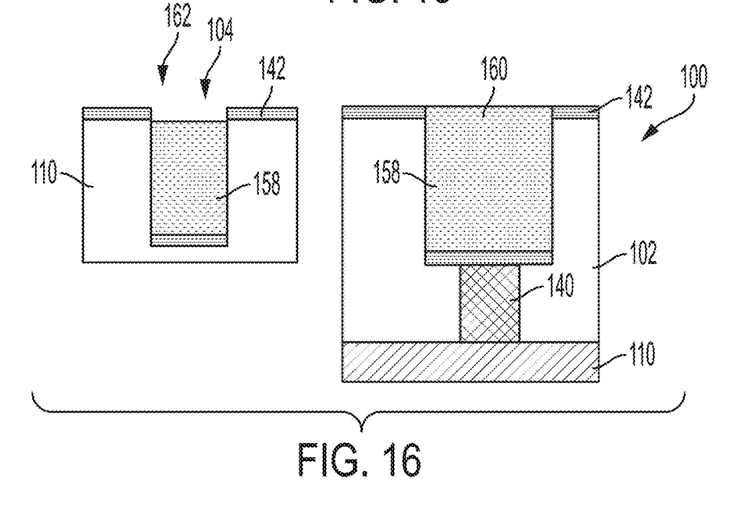
FIG. 16 s is a schematic cross-sectional view of the structure of FIG. 15 subsequent to overburden removal to the metal hardmask.

FIG. 16 is a schematic cross-sectional view of the structure of FIG. 15 subsequent to removal of the overburden 122 stopping at the metal hardmask 112 such that metal filled trench portions 158 are formed that are coplanar with the metal hardmask 114. For example, the overburden 156 can be removed by chemical mechanical polishing (CMP). The CMP process planarizes the surface to remove the overburden by a combination of chemical and mechanical forces using a non-selective slurry composition generally known in the art. The slurry composition contains a silica abrasive material, which removes the different metal layers at substantially the same rate. The CMP process can be configured to form a recess 162 in the trench structure 104.

Figure 17:
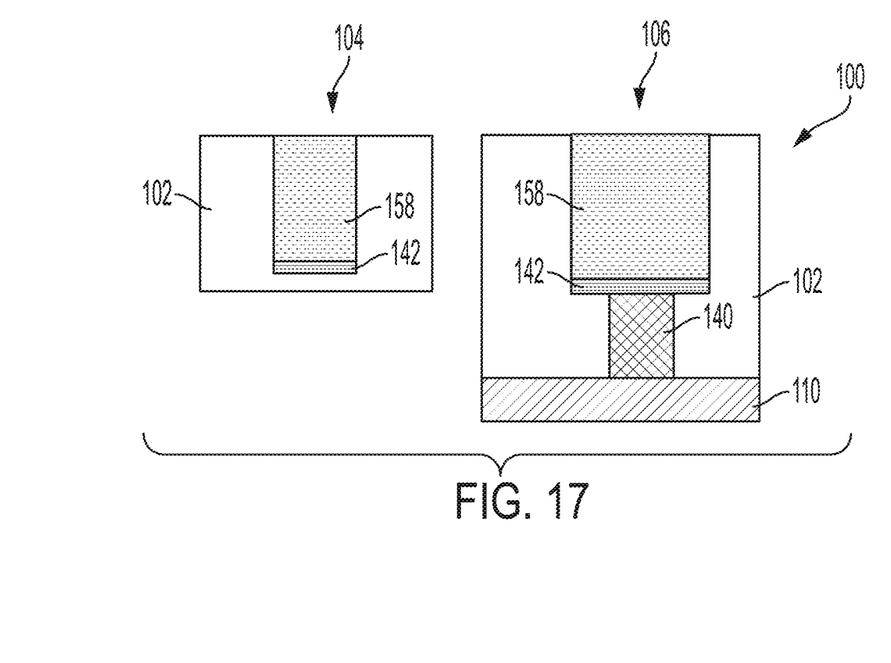
FIG. 17 is a schematic cross-sectional view of the structure of FIG. 16 subsequent to wet etch of the metal hardmask and a portion of the tantalum nitride to the dielectric layer.

FIG. 17 is a schematic cross-sectional view of the structure of FIG. 16 subsequent to removal of the metal hardmask 142 from the field surfaces such that the tantalum nitride trench is coplanar to the dielectric layer 102.

As shown, the surface of structure has been planarized using a process such as CMP. As noted above, the CMP process generally includes polishing the top surface and stopping at the dielectric layer to remove the metal overburden that was deposited during deposition of the bulk conductor. The particular CMP process is not intended to be limited and will generally depend on the materials used.

Subsequent to planarization, the MTJ stack is disposed on the bottom electrode. The MTJ stack (not shown) generally includes an anti-ferromagnetic layer, a pinning layer, and a free layer. However, it should be recognized that different magnetic tunnel junction layers can also be present in practical applications. For example, magnetic tunnel junction layers can include a tunnel barrier layer. In addition, more or fewer magnetic tunnel junction layers can be incorporated into the MRAM device.

The reference layer and the free layer include conductive, magnetic metals or metal alloys. The free layer and the reference layer are magnetically de-coupled by the tunnel barrier, wherein the free layer has a variable magnetization direction, and the reference layer has an invariable magnetization direction. The layers of the MTJ stack can be formed by sputter-deposition techniques with deposition rates in the Angstrom-per-second range using for example, vapor deposition, specifically planar magnetron sputtering, and ion-beam deposition.

A top electrode is formed over the MTJ stack layers. In one or more embodiments, the top electrode layer is formed on the free layer. The top electrode layer can be copper, aluminum, tantalum, tungsten, tantalum nitride (TaN), titanium, titanium nitride (TiN), the like, and/or a combination thereof. The top electrode layer can be formed by acceptable deposition techniques, such as chemical vapor deposition (CVD), atomic layer deposition (ALD), physical vapor deposition (PVD), the like, and/or a combination thereof. The bottom (bulk conductor) and top electrodes can be the same or different.

While the present invention has been particularly shown and described with respect to preferred embodiments, it will be understood by those skilled in the art that the foregoing and other changes in forms and details can be made without departing from the spirit and scope of the invention. It is therefore intended that the present invention not be limited to the exact forms and details described and illustrated but fall within the scope of the appended claims.

What is claimed is:

1. A process of forming a bottom electrode in a magnetoresistive random access memory (MRAM) device, the process comprising:
filling a via in a trench/via structure embedded within a dielectric with a metal, wherein the metal comprises tantalum, cobalt, ruthenium, or tungsten;
conformally depositing a metal hardmask;
depositing tantalum nitride into the trench and forming an overburden of the tantalum nitride;
planarizing the tantalum nitride to the metal hardmask; and
removing the metal hardmask from field surfaces and a portion of the tantalum nitride such that a top surface of the tantalum nitride is coplanar to a top surface of the dielectric layer to form the bottom electrode.

2. The process of claim 1, wherein removing the metal hardmask from the field surfaces and the portion of the tantalum nitride comprises a wet etching process.

3. The process of claim 1, wherein removing the metal hardmask and the portion of the tantalum nitride comprises wet etching process at about equal rates of removal.

4. The process of claim 1, wherein filling the via in the trench/via structure embedded within a dielectric with the metal comprises an electroless process.

5. The process of claim 1, wherein filling the via with the metal and depositing the tantalum nitride into the trench are separate steps.

6. The process of claim 1, wherein the via comprises tungsten and filling the via comprises conformally depositing the tungsten to fill the via followed by wet etching the tungsten from sidewall surfaces of the trench and field surfaces.

7. The process of claim 1, wherein planarizing the tantalum nitride to the metal hardmask comprises a chemical mechanical planarization process.

8. The process of claim 1, wherein the metal comprises cobalt or ruthenium, and filling the via comprises a chemical vapor deposition process.

9. The process of claim 1, wherein the via provides via a conductive pathway to the bottom electrode and an underlying interconnect structure.

10. The process of claim 1, wherein the metal hardmask comprise titanium, titanium nitride, tantalum, tantalum nitride, ruthenium or tungsten.

11. A process of forming a bottom electrode in a magnetoresistive random access memory (MRAM) device, the process comprising:
conformally depositing tungsten in an amount effective to fill a via in a trench/via structure embedded within a dielectric;
removing the tungsten from sidewalls of the trench and field surfaces;
conformally depositing a metal hardmask;
depositing tantalum nitride into the trench and forming an overburden of the tantalum nitride;
planarizing the tantalum nitride to the metal hardmask; and
removing the metal hardmask from field surfaces and a portion of the tantalum nitride such that a top surface of the tantalum nitride is coplanar to a top surface of the dielectric layer to form the bottom electrode.

12. The process of claim 11, wherein the metal hardmask comprise titanium, titanium nitride, tantalum, tantalum nitride, ruthenium or tungsten.

13. The process of claim 11, wherein the via provides via a conductive pathway to the bottom electrode and an underlying interconnect structure.

14. The process of claim 11, wherein planarizing the tantalum nitride to the metal hardmask comprises a chemical mechanical planarization process.

15. The process of claim 11, wherein removing the metal hardmask from field surfaces and a portion of the tantalum nitride comprises a wet etch process.

16. The process of claim 15 further comprising redepositing the tantalum nitride in a recess formed in the tantalum nitride subsequent to the wet etch process followed by chemical mechanical planarization such that the top surface of the tantalum nitride is coplanar to the top surface of the dielectric layer.

* * * * *